United States Patent [19]

Yoshihara

[11] Patent Number: 5,023,653
[45] Date of Patent: Jun. 11, 1991

[54] IMAGE RECORDING APPARATUS HAVING SHEET SLACK ABSORBING MEANS

[75] Inventor: Hideo Yoshihara, Kasugai, Japan

[73] Assignee: Brother Kogyo Kabushiki Kaisha, Nagoya, Japan

[21] Appl. No.: 582,161

[22] Filed: Sep. 14, 1990

[30] Foreign Application Priority Data

Oct. 30, 1989 [JP] Japan ................................. 1-282233
Oct. 30, 1989 [JP] Japan ................................. 1-282234
Oct. 30, 1989 [JP] Japan ................................. 1-282235

[51] Int. Cl.$^5$ ....................... G03B 27/32; G03B 27/52
[52] U.S. Cl. ................................................. 355/27
[58] Field of Search ........................... 355/27, 50, 51; 354/299–302; 430/138; 226/118; 352/184, 159

[56] References Cited

U.S. PATENT DOCUMENTS

| 4,777,513 | 10/1988 | Nelson | 226/118 X |
| 4,935,768 | 6/1990 | Ibuchi | 355/27 |
| 4,945,381 | 7/1990 | Yamagata et al. | 430/138 X |
| 4,945,382 | 7/1990 | Yui et al. | 355/27 |
| 4,952,968 | 8/1990 | Ibuchi | 355/27 |
| 4,959,681 | 9/1990 | Ogura | 355/27 |

Primary Examiner—Richard A. Wintercorn
Attorney, Agent, or Firm—Oliff & Berridge

[57] ABSTRACT

An image recording apparatus having a sheet slack absorbing means pivotally movable between first and second positions. In the first position, a dancer roller of the sheet slack absorbing means is in contact with a microcapsule layer of the microcapsule sheet for absorbing sheet slack during exposure operation. In the second position, the dancer roller is out of contact with the microcapsule sheet. The second position is provided at a non-operative state of the apparatus, or at the standby state thereof. The second position is also provided for directing a leader portion of the microcapsule sheet toward a takeup shaft. In this case, the dancer roller serves as a guide means for guiding travel of the leader portion. The second position is further provided when unexposed zone of the microcapsule sheet is reversely fed to the upstream side of an exposure stand for a next exposure operation.

4 Claims, 6 Drawing Sheets

IMAGE RECORDING APPARATUS HAVING SHEET SLACK ABSORBING MEANS

BACKGROUND OF THE INVENTION

The present invention relates to an image recording apparatus which employs an elongated photosensitive image recording medium. More particularly, the invention relates to such image recording apparatus having a sheet slack absorbing roller and a driving mechanism therefor.

In one type of a conventional image recording apparatus, a dancer roller is provided for absorbing a sheet slack which may be provided in the image recording operation. Further, the photosensitive image recording medium includes a microcapsule sheet in which microcapsules encapsulating therein chromogenic materials are coated on a substrate. In the conventional apparatus, an outer peripheral surface of the dancer roller is not in contact with the microcapsule layer but is in contact with the substrate surface. Therefore, no contamination occurs in the roller surface due to the transfer of the chromogenic materials from the ruptured microcapsules. In other words, since no deposition of the chromogenic materials occurs at the outer surface of the dancer roller, the microcapsules coated on the microcapsule sheet substrate can be protected against any damage.

However, when taking an entire microcapsule sheet path into consideration, another spacial problem arises such as minimization of the sheet path length, and layout of entire components of the recording apparatus, yet providing large motion of the dancer roller for absorbing great amount of the sheet slack. Consequently, there has been provided an another type of an image recording apparatus in which the microcapsule layer is in contact with the surface of the dancer roller.

As is well known in the art, the microcapsules are photo-cured upon light exposure, and therefore, the photo-cured portions is not ruptured. However, if unexposed area of the microcapsule sheet where no latent image is formed thereon is in contact with the dancer roller surface or nip rollers or feed rollers, the unexposed microcapsules are easily ruptured on these roller surfaces. Such ruptured portions may degrade quality of the output image.

Further, in the image recording operation, the unexposed microcapsule sheet zone may be moved to the immediately upstream side of the pressure developing roller for performing the pressure developing operation with respect to the light exposed zone of the microcapsule sheet forming a latent image thereon. In this case, in order to save cost, the unexposed zone of the microcapsule sheet is reversely fed toward an exposure table for a next exposure operation against the unexposed zone. However, the unexposed area of the microcapsule sheet is in contact with the dancer roller, so that the unexposed microcapsules may be ruptured. Moreover, during non operative state of the image recording apparatus or standby state thereof, if the microcapsule layer is continuously contacted with the dancer roller surface, the dancer roller surface may be contaminated with the materials of the microcapsules.

In another aspect of this art, when a new microcapsule sheet is intended to be installed in the image recording apparatus, a leader tape portion of the microcapsule sheet must pass through the microcapsule sheet path. For correctly directing the leader tape portion along the sheet path in order to install the microcapsule sheet at the sheet path, conventionally, guide members are provided at a space between rollers such as feed rollers. The guide members are formed of iron or resin plate. However, if the guide member has an enlarged area, its mechanical strength may be lowered, and deformation may occur. If the guide member is deformed, the microcapsule sheet path may be deviated. Further, if the guide members are juxtaposedly provided along the sheet path with a narrow distance, the deformation of the guide plates may affect the travel of the leader portion, and further, it would be rather troublesome for assembling such guide plates in the limited space of the image recording apparatus. If the guide member is excessively deformed, the subsequent microcapsule sheet may contact with the guide plate surface, which in turn damages to the surface of the microcapsule sheet, and sheet wrinkle may occur. Furthermore, after the leader tape portion reaches the takeup shaft and is correctly wound thereover, the guide member for guiding the leader tape portion is not any more required. Moreover, if the dancer roller is positioned at the sheet path, the leader portion may abut the dancer roller, and therefore, the leader portion cannot reach the takeup shaft. And if the dancer roller is positioned above the sheet path at the time of sheet loading, the sheet slack absorbing function may not be achievable after the microcapsule sheet is installed at the sheet path.

In still another aspect, the conventional dancer roller is linearly movable by making use of its own weight so as to provide the sheet slack absorbing function. This linear movement is only available in a case where small sheet slack amount is provided. However, in an attempt to carry out large sheet slack absorbing function, the linear moving stroke must be large, and therefore, large space must be required for allowing the dancer roller to be movable by a large distance. Hence, a mechanism for linearly moving the dancer roller by a large distance may become complicated.

SUMMARY OF THE INVENTION

In view of the above-described drawbacks, the present invention has been made to provide an improved image recording apparatus in which direct contact of an unexposed area of a microcapsule sheet with a dancer roller is avoidable to thus provide a high grade output image without any damage to the microcapsule sheet by the dancer roller, and the direct contact between the microcapsule sheet and the dancer roller is also avoidable during non-operative state of the image recording apparatus and during standby state thereof to avoid contamination of the dancer roller with the microcapsule materials.

Another object of the present invention is to provide such improved image recording apparatus capable of automatically loading the microcapsule sheet at its sheet path by making use of the dancer roller without any employment of independent guide members.

Still another object of the present invention is to provide the image recording apparatus having an improved dancer roller and its driving mechanism in which large amount of sheet slack can be absorbed with a simple construction.

These and other objects of the present invention will be attained by an image recording apparatus which uses an elongated photosensitive recording medium having a photosensitive pressure sensitive layer comprises; sheet feed means for feeding the elongated photosensitive recording medium, an exposure unit for exposing the photosensitive recording medium to light for forming a latent image thereon, a pressure developing unit positioned downstream of the exposure unit with respect to the sheet feeding direction for pressure developing the latent image on the photosensitive recording medium into a visible image, a sheet slack absorbing means positioned between the exposure unit and the pressure developing unit, the sheet slack absorbing means being pivotably movable between a first position to absorb a sheet slack with contacting the photosensitive pressure sensitive layer and a second position out of contact with the photosensitive recording medium, and drive means for selectively driving the sheet slack absorbing means to one of the first and the second positions.

The second position is provided during non-operative state of the image recording apparatus, standby state thereof and when a leader portion of the image recording medium is fed along a sheet path. The second position is also provided when unexposed area of the image recording medium is fed back to the upstream side of the exposure unit for performing a next exposure operation to the unexposed area, since the unexposed area is inevitably fed to the downstream side of the exposure unit for performing a pressure developing operation with respect to an exposed area of the image recording medium which is positioned ahead of the unexposed area.

DETAILED DESCRIPTION OF THE PREFERRED EMBODIMENT

An image recording apparatus having a sheet slack absorbing means according to one embodiment of this invention will be described with reference to accompanying drawings.

Figure 1:
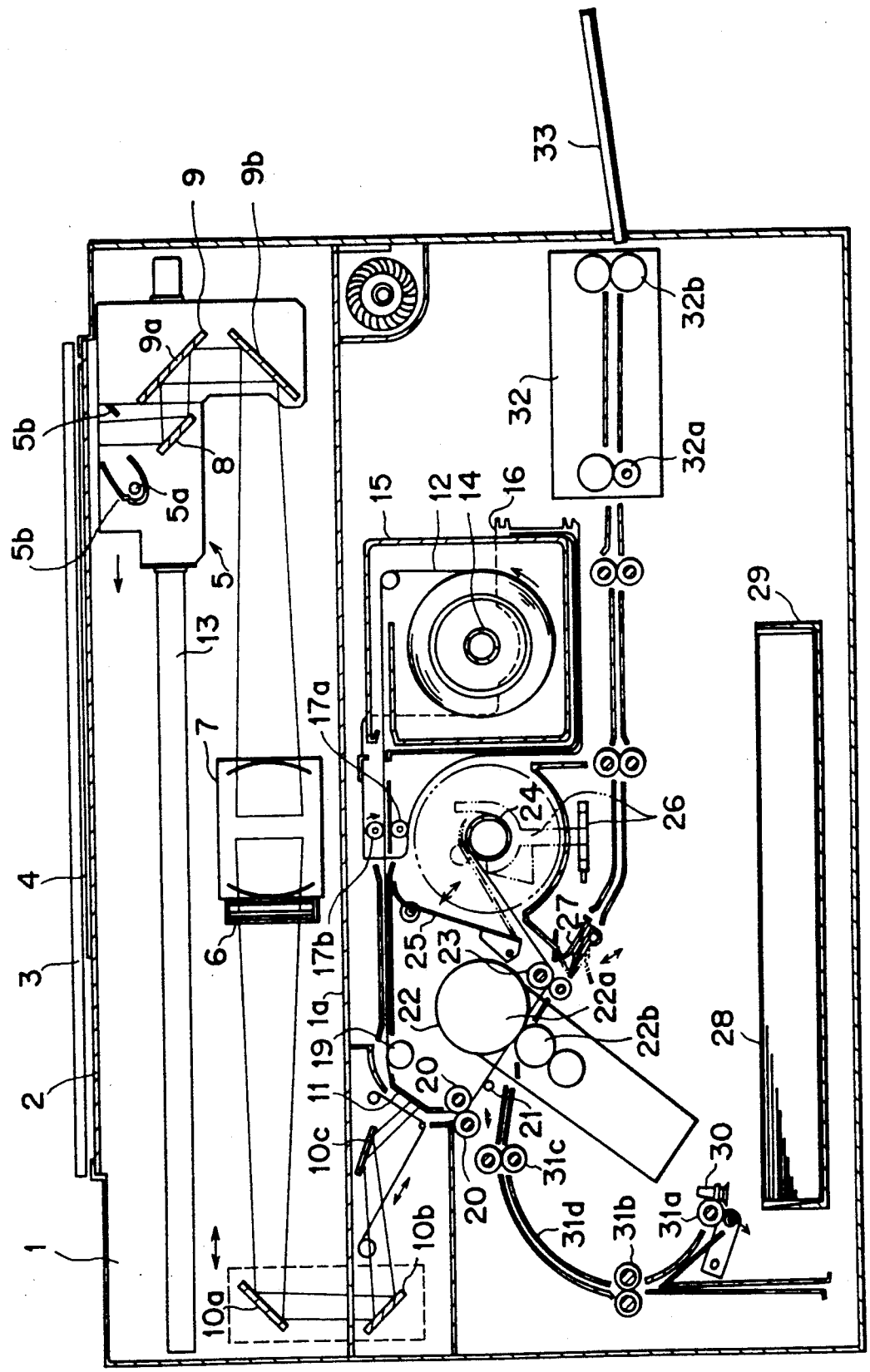
FIG. 1 is a schematic cross-sectional view showing an image recording apparatus having a dancer roller or a sheet slack absorbing roller according to one embodiment of the present invention.

FIG. 1 shows an overall structure of an image recording apparatus 1 which generally employs an elongated photosensitive pressure sensitive image recording sheet or a microcapsule sheet 12 and a cut developer sheet or an output image recording sheet 28. The microcapsule sheet 12 has a substrate whose surface is coated with microcapsules encapsulating therein chromogenic materials reactable with a developer material coated over a substrate of the developer sheet 28. By this reaction, an output color image is provided on the developer sheet 28. Details of these image recording mediums are disclosed in a U.S. Pat. No. 4,399,209, and therefore, further description can be neglected.

At a top portion of the image recording apparatus 1, a transparent original support glass 2 for mounting thereon an original 4 is provided, and a support glass cover 3 is pivotally disposed over the original support glass 2. Between the support glass 2 and the cover 3, the original 4 is positioned with its imaging surface facing downwardly.

An optical system is provided below the original support glass 2. The optical system includes a light source 5 including a halogen lamp 5a, reflectors 5b, and a reflection mirror 8, and a frame member 5c is provided for housing therein the light source 5. The frame member 5c is formed with a slit (not shown) for allowing light to pass therethrough toward the original support glass 2. A shaft 13 extends in parallel with the original support glass 2, and the frame member 5c is reciprocally movable along the shaft 13. The light source 5 provides a line light toward the original support glass 2 in a direction perpendicular to the moving direction of the frame member 5c. The light passing through the original support glass 2 is reflected at the original 4 and is directed downwardly.

The optical system also includes a first pair of reflection mirrors 9a, 9b supported by the frame member 5c but movable independent of the light source 5, another pair of reflection mirrors 10a, 10b, a projection lens 7, a filter unit 6 and a final reflection mirror 10c. The lens 7 and the filter unit 6 are positioned between the first and second pairs of the reflection mirrors 9a, 9b and 10a, 10b. The filter unit 6 is adapted for controlling color tone of a final output image. The light reflected from the original 4 is reflected at the reflection mirror 8 and the first pair of reflection mirrors 9a, 9b, so that the light is directed toward the second pair of the reflection mirrors 10a, 10b through the lens 7 and the filter 6 in a direction in parallel with the moving direction of the light source 5.

An exposure stand 11 is provided at a position adjacent the second pair of the reflection mirrors 10a,10b for exposing the microcapsule sheet 12 to image carrying light. For this, the final reflection mirror 10c is provided between the reflection mirror 10b and the exposure stand 11 for directing the light reflected from the second pair of the reflection mirrors 10a, 10b toward the exposure stand 11. Accordingly, a latent image corresponding to the image of the original is formed on the microcapsule sheet 12 positioned on the exposure stand 11.

The second pair of the reflection mirrors 10a, 10b are normally stationarily positioned. However, these mirrors are movable together in the axial direction of the shaft 13 so as to control an optical path length in accordance with the change in copying magnification (m) such as size enlargement or reduction. Further, provided that a feeding velocity of the microcapsule sheet 12 is represented by "V", and the copying magnification is represented by "m", the moving speed of the halogen lamp 5a and the mirror 8 is set to V/m, and the moving speed of the first pair of reflection mirrors 9a and 9b is set to V/2 m in order to obtain the latent image on the microcapsule sheet 12 positioned on the exposure stand 11 with the desired magnification m.

Figure 2:
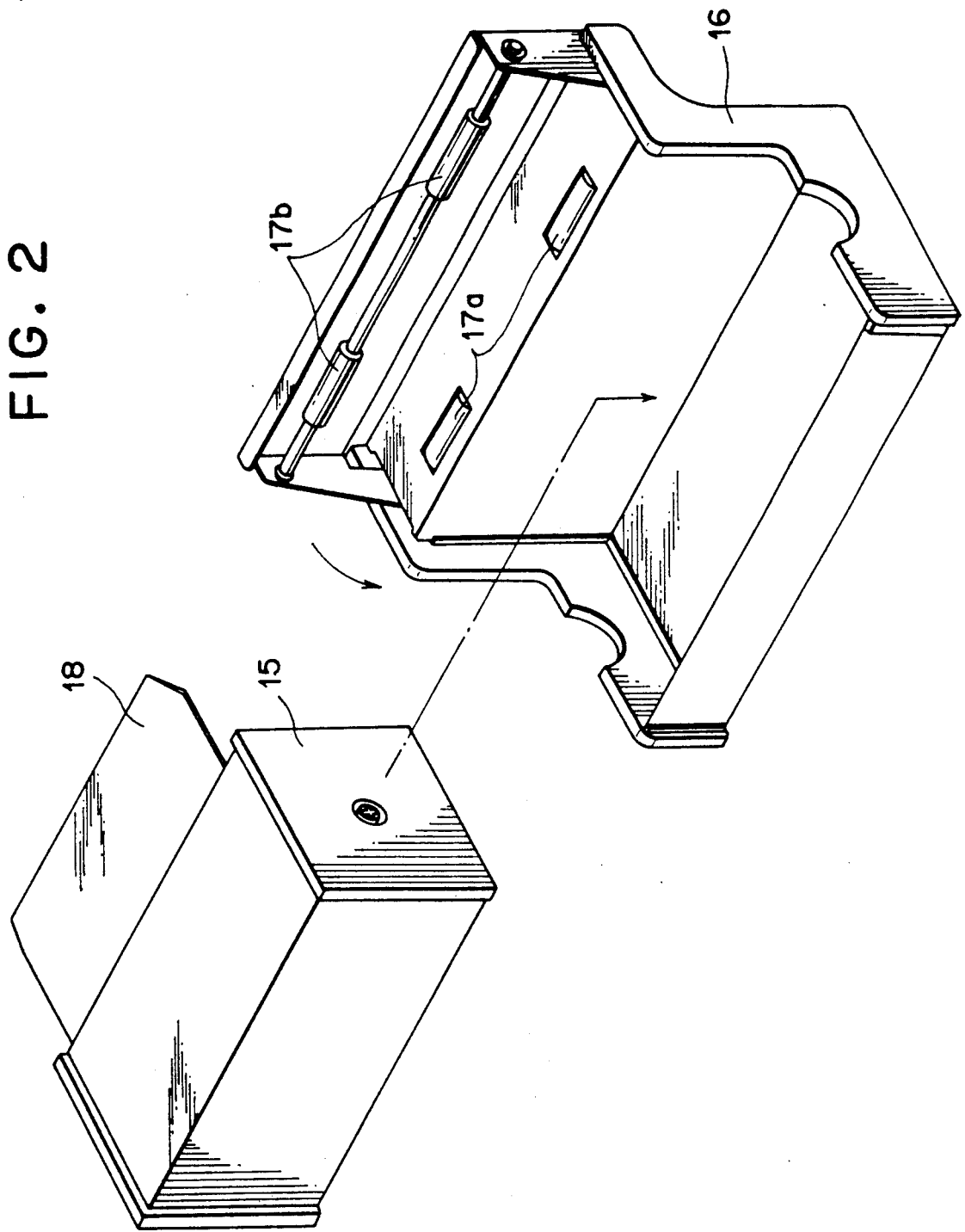
FIG. 2 is a exploded perspective view showing a magazine for receiving therein a sheet cartridge used in the image recording apparatus of the present invention.
Figure 3:
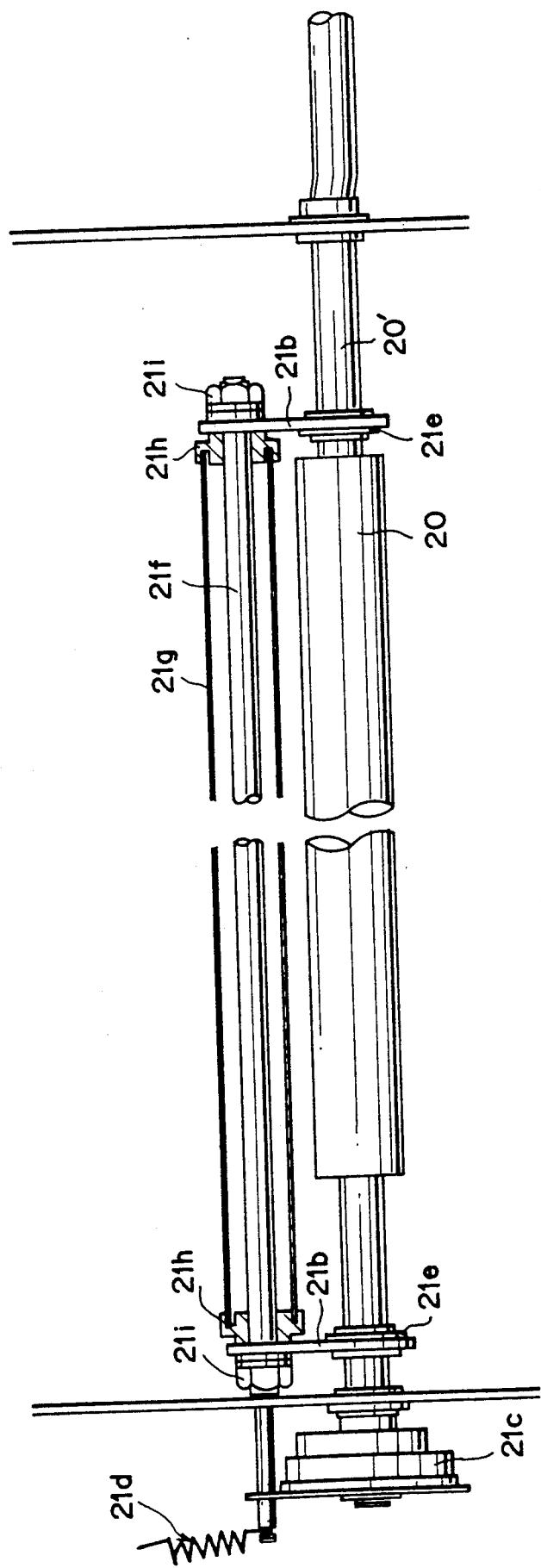
FIG. 3 is a front view showing the dancer roller and a driving mechanism therefor according to one embodiment of this invention.

The elongated microcapsule sheet 12 is of a rolled form and a leading end portion of the sheet 12 is provided with a leader tape portion 18 (FIG. 2). More specifically, at a center portion of the copying apparatus 1, a magazine 16 is disposed, and a sheet cartridge 5 is detachably positioned in the magazine 16. In the sheet cartridge 15, a rolled microcapsule sheet 12 is wound over a cartridge shaft 14. As shown in FIG. 2, the magazine 16 includes a pair of rollers 17a and 17b for nipping the leader tape portion 18 therebetween. These rollers 17a and 17b are connected to a power source (not shown) and serve to introduce the leader tape portion 18 into a predetermined position of the sheet path. These rollers 17a and 17b have circular cross-section. However, a sector roller (not shown) is also available.

Further, feed rollers 19 is rotatably provided at a position downstream of the pair of rollers 17a, 17b, and another feed rollers 20, 20 are rotatably provided at a position downstream of the feed roller 19. One of the feed rollers 20 is movable toward and away from the remaining feed roller 20. Between the feed rollers 19 and 20, the exposure stand 11 is provided. Moreover, a dancer roller or a tension control roller 21 is provided for controlling a sheet slack of the microcapsule sheet, and a separation roller 23 is rotatably provided for separating the microcapsule sheet 12 from the developer sheet 28. A pressure developing unit 22 having a large diameter pressure roller 22a and a back-up roller 22b is positioned between the dancer roller 21 and the separation roller 23 for pressure developing operation. A takeup shaft 24 is provided for taking up the light exposed microcapsule sheet 12. Thus, the microcapsule sheet path is defined by, in order, the feed rollers 17a, 17b, the feed roller 19, an upper surface of the exposure stand 11, the feed rollers 20, the dancer roller 21, the pressure developing unit 22, the separation roller 23 and the takeup shaft 24. Incidentally, a partitioning wall 1a is provided so as to prevent the microcapsule sheet 12 positioned at upstream of the exposure stand 11 from being irradiated with light.

The feeding velocity of the microcapsule sheet 12 is controlled at constant speed, and the feeding movement is in synchronism with the movements of the mirrors 8, 9a and 9b. Accordingly, a latent image in line-by-line basis is successively provided on the microcapsule sheet 12 when it passes through the exposure stand 11.

Figure 6:
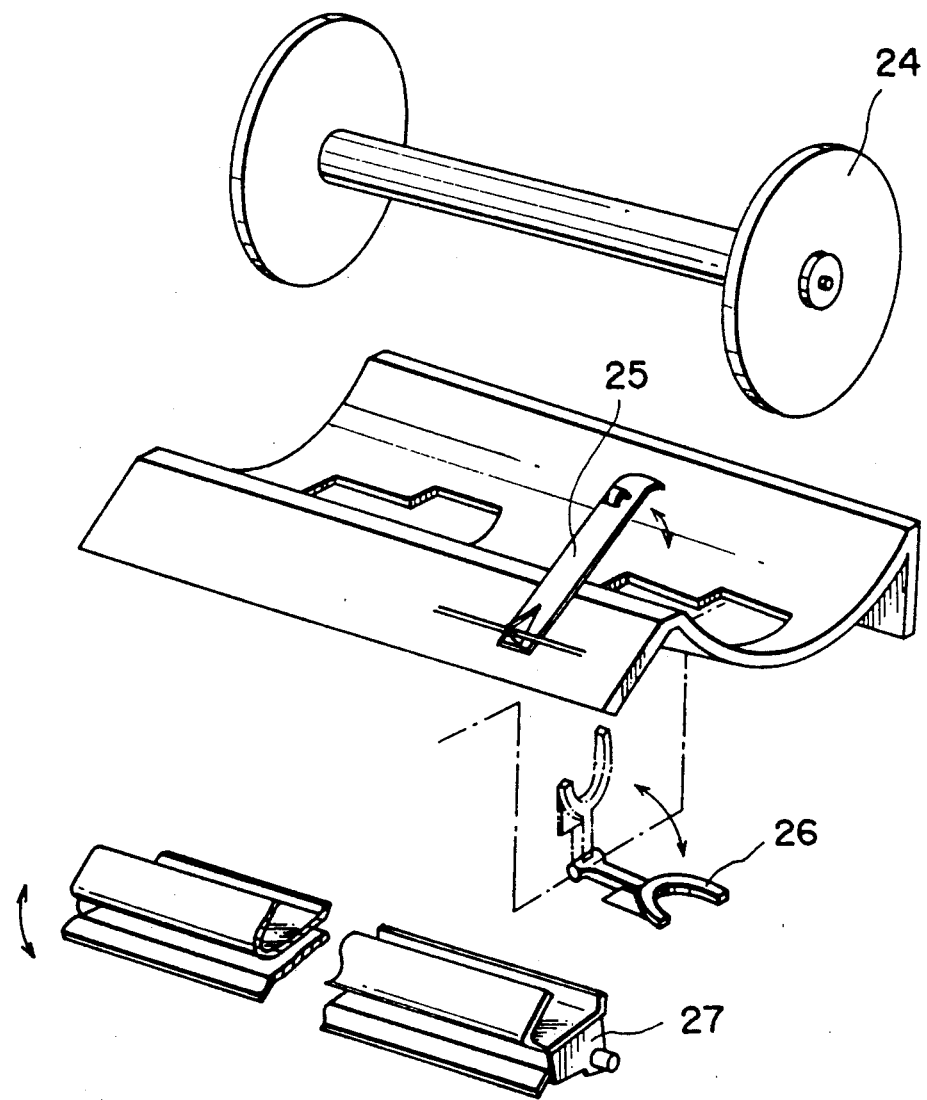
FIG. 6 is an exloded perspective view showing upper and lower guides, and a seapration chute according to one embodiment of the present invention.

An automatic sheet loading function is given in the image recording apparatus of this embodiment. By the automatic loading function, the leader tape portion 18 of the rolled microcapsule sheet 12 can be automatically directed along the sheet path and is wound over the takeup shaft 24. Therefore, the subsequent microcapsule sheet 12 can be automatically installed at the sheet path. For this automatic loading, the pair of feed rollers 17a and 17b or the sector roller (not shown) provided in the magazine will initiate the pulling out operation of the leader portion 18. Further, a separation chute 27 is pivotably provided at a position downstream of the separation roller 23 so as to direct the leader portion toward the takeup shaft 24. Furthermore, an upper guide 25 and a lower guide 26 are provided immediately above and below the takeup shaft 24, respectively for guiding the winding of the leader portion 18 over the takeup shaft 24. As best shown in FIG. 6, the lower guide 26 is pivotably provided and movable between a solid line position and a dotted line position. Further, as shown in FIG. 6, the upper guide 25 and the separation chute 27 are also pivotally movable in the directions indicated by respective arrows.

For loading the microcapsule sheet at the sheet path, the upper guide 25, the lower guide 26 and the separation chute 27 are moved to positions indicated by a dotted chain lines in FIG. 1 for permitting the leader tape 18 to be wound over the takeup shaft 24, On the other hand, when the loading operation is completed, these are moved to positions indicated by solid lines in FIG. 1, so that image recording operation is achievable. Incidentally, one of the feed rollers 17a is movable away from the sheet path upon completion of the automatic sheet loading.

At a position below the pressure developing unit 22, a sheet cassette 29 is installed in which a stack of the cut developer sheets 28 are stored. At a position above the cassette 29, a sheet feed mechanism 30 is provided which includes a suction means so as to deliver each one of the developer sheets 28 toward the pressure developing unit 22. Between the sheet feed mechanism 30 and the pressure developing unit 22, sheet feed rollers 31a, 31b, 31c and a sheet feed guide 31d are provided. The developer sheet 28 is thus delivered to an upstream side of the pressure developing unit 22.

Further, a thermal fixing unit 32 is provided at a position downstream of the separation chute 27. The thermal fixing unit 32 includes a heat roller 32a and a discharge roller 32b. A discharge tray 33 is provided at a position downstream of the thermal fixing unit for receiving the developer sheet 28 in which a visible output image is formed.

Next, a sheet slack absorbing mechanism including the dancer roller 21 will be described with reference to FIGS. through 5.

The feed roller 20 for feeding the microcapsule sheet 12 has a roller shaft 20' on which bearing members 21e, 21e are mounted. On the other hand, the dancer roller 21 has a dancer roller shaft 21f on which bearing members 21h, 21h are fixedly mounted. Further, dancer roller arms 21b, 21b are mounted between the bearings 21e and 21h. A dancer roller pipe 21g is coaxially disposed over the dancer roller shaft 21f, and is rotatably supported by the bearings 21h, 21h. Hexagonal nuts 21i, 21i are threadingly engageable with the bearing members 21h, 21h, so that each one ends of the dancer roller arm 21b, 21b is fixedly secured. Therefore, the dancer roller shaft 21f is provided integral with the dancer roller arms 21b, 21b.

Figure 4:
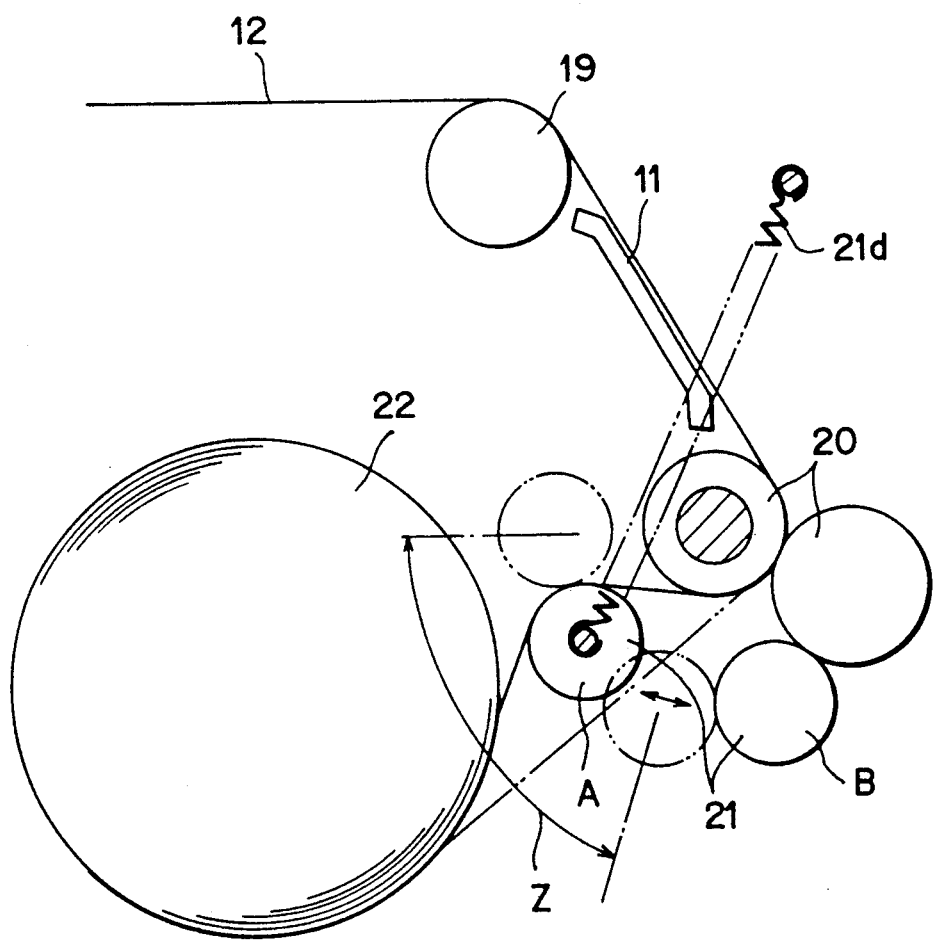
FIG. 4 is a schematic illustration for description of the movement of the dancer roller in the present embodiment.
Figure 5:
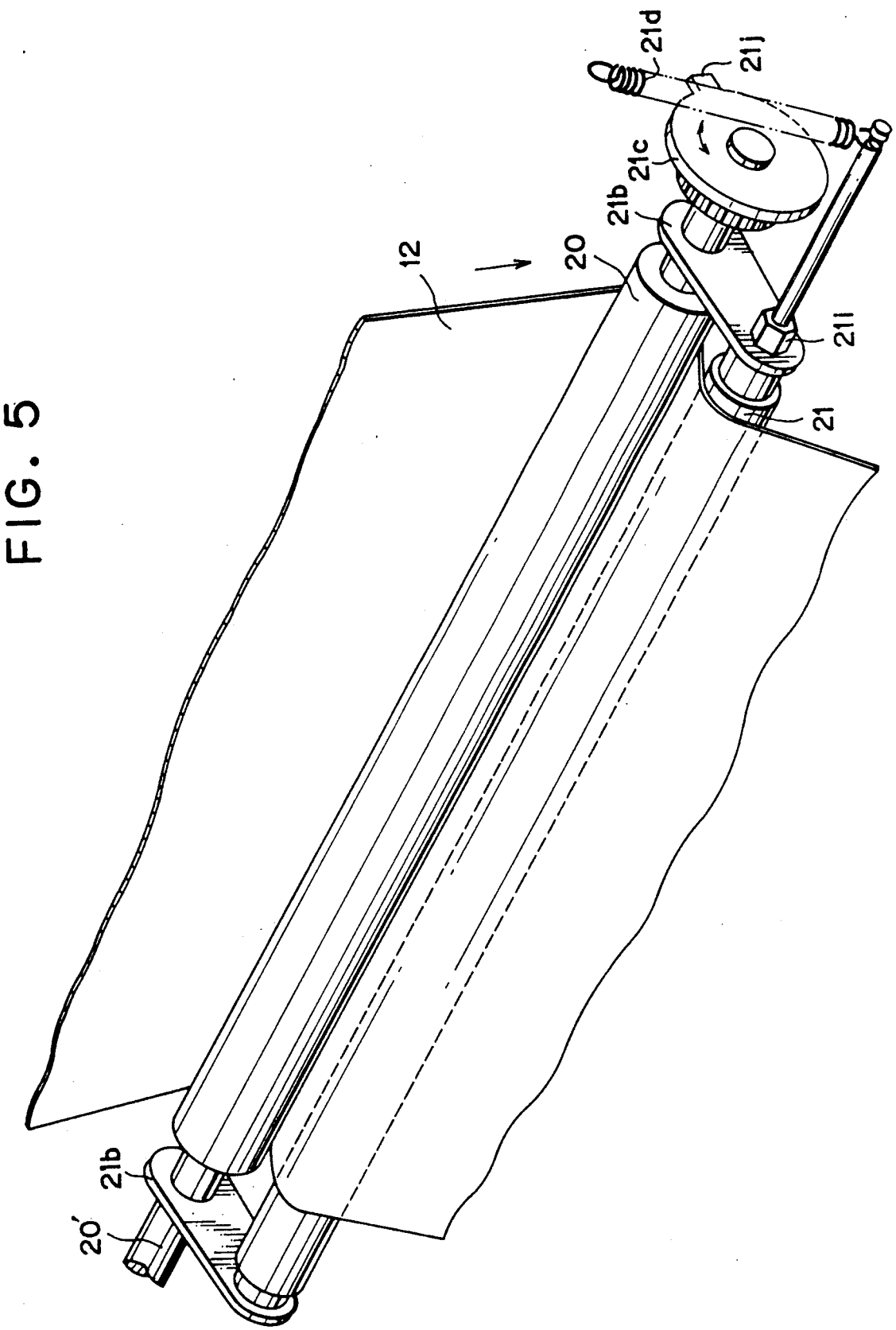
FIG. 5 is a perspective view showing the dancer roller and the driving mechanism in the present embodiment.

A dancer roller spring 21d is provided for selectively positioning the dancer roller 21 either to a sheet slack absorbing position and an another position. That is, one end of the dancer roller spring 21d is connected to the dancer roller shaft 21f so as to normally pivotally move the dancer roller shaft 21f to one rotational direction (clockwise direction in FIGS. 4 and 5 about an axis of the feed roller shaft 20'. Another end of the spring 21d is secured to a stationary position such as an outer frame of the image recording apparatus. In FIG. 5, the dancer roller 21 is movable to a position indicated by a position A so as to absorb a slack of the microcapsule sheet 12 during the exposure operation. Further, a gear 21c is fixedly mounted on the feed roller shaft 20'. The gear 21c is rotatably driven by a power source (not shown). The gear 21c has a flanged portion in which a protection 21j protrudes radially outwardly. Upon driving rotation of the gear 21c, in a direction (counterclockwise direction in FIG. 5) opposite the angular rotational direction of the dancer roller 21 about the shaft 20', the projection 21j is brought into abutment with the dancer roller shaft 21f, and urges the latter in the opposite direction against the biasing force of the spring 21d. However, if the dancer roller 21 is angularly moved in the opposite direction to a predetermined distance, the dancer roller 21 is further urged by the dancer roller spring 21d to obtain a position B. That is, a dead point is provided with respect to the dancer roller spring 21d at a given angular position of the dancer roller 21. The position B is the another position of the dancer roller 21 where the dancer roller 21 is out of contact with the microcapsule sheet 12 as shown in FIG. 4. If the dancer roller 21 is positioned at the another position B, the dancer roller 21 is out of contact with the microcapsule sheet 12 during standby state of the image recording operation. Further, at the another position B of the dancer roller 21, the dancer roller 21 does not become an obstacle for allowing the leader tape portion 18 of the microcapsule sheet 12 to direct toward the takeup shaft 24, but can serves as a guide means for directing the leader portion thereto during the automatic sheet loading operation. Incidentally, in FIG. 4, "Z" represents a dancer range of the dancer roller 21 for sheet slack absorbing movement.

With this structure, if the sheet cartridge 15 is mounted on the magazine 16, the automatic sheet loading operation will be initiated. The feed rollers 17a, 17b or the sector roller (not shown) is rotated about its axis by at least once so as to pull out the leader tape portion 18 from the cartridge 15 to the feed rollers 20, 20. Then, the rotation of the feed rollers 17a, 17b is stopped in such a manner that one of the feed rollers 17a is releasably held whereas the feed rollers 20, 20 are driven to further feed the leader tape portion 18 toward the pressure developing unit 22. In this case, the separation chute 27, the upper guide 25 and the lower guide 26 are moved to positions indicated by one dotted chain lines in FIG. 1, so that the leader tape portion 18 can be directed to the takeup shaft 24 and is wound thereover. Upon completion of the automatic sheet loading, the upper guide 25, the lower guide 26 and the separation chute 27 are moved to their solid line positions shown in FIG. 1 for performing the image recording operation.

For achieving the automatic sheet loading operation, the dancer roller 21 is moved to another position B, so that the leader tape portion 18 can be moved at a position above the dancer roller 21 and can be directed to the pressure developing unit 22. In other words, in the another position B, the dancer roller 21 serves as a guide means for guiding the travel of the leader tap 18 along the sheet path. For this, the gear 21c is driven (counterclockwise direction in FIG. 5) in the opposite direction to pivotally move the dancer roller in the opposite direction about the axis of the feed roller shaft 20'. The position B is fixed by the biasing force of the spring 21d after it passes over its dead point.

If a copy start key (not shown) is manipulated, the reflection mirror 8 and the halogen lamp 5a are moved at a speed V/m, and the first pair of reflection mirrors 9a, 9b are moved at a speed V/2 m assuming that the microcapsule sheet 12 is fed at a speed of V with aiming at image magnification of m. Since the feeding speed of the microcapsule sheet 12 is synchronized with the moving speeds of the mirrors 8, 9a, 9b, a line latent image is successively formed on the microcapsule sheet 12 when it passes over the exposure stand 11.

The microcapsule sheet 12 which carries the latent image is further transferred toward the pressure developing unit 22, and at the same time, the developer sheet 28 is fed thereto by the sheet feed mechanism 30 and the feed rollers 31a, 31b, 31c. The latent image surface of the microcapsule sheet 12 is superposed with the developer material surface of the developer sheet 28 at the pressure developing unit 22, and these are pressed together. Therefore, unexposed microcapsules are ruptured to provide a chromogenic reaction with the developer materials of the developer sheet 28, to thereby form a visible color image on the developer sheet 28.

The microcapsule sheet 12 passed through the pressure developing unit 22 is separated from the developer sheet 28 by the separation roller 23. Then, the developer sheet 28 is fed to the thermal fixing unit 32 where the coloring of the visible image is promoted by the heat roller 32a. The thus treated developer sheet 28 is discharged out of the thermal fixing unit by the discharge roller 32b and is fed onto the discharge tray 33.

During the exposure operation, the dancer roller 21 is positioned at the sheet slack absorbing position A by the biasing force of the dancer roller spring 21d so as to absorb any slack of the microcapsule sheet 12. On the other hand, if the trailing edge portion of the light exposed zone of the microcapsule sheet 12 reaches the feed rollers 20, the gear 21c is driven to be rotated in the opposite direction, so that the dancer roller 21 is positioned to the another position B. In this case, sheet slack may occur. However, during the movement of the dancer roller 21 from the position A to the position B, the feeding speed of the pressure developing unit 22 is increased so a to reduce the sheet slack. Further, this operation is carried out before a subsequent leading edge line of an unexposed area of the microcapsule sheet 12 reaches the dancer roller position 21 from the feed roller position 20. Furthermore, during this period, one of the feed rollers 20 is moved away from the other feed roller 20 so as to release sheet nipping force which otherwise be provided between the feed rollers 20 and 20. As a result, the subsequent unexposed area of the microcapsule sheet 12 is not subjected to any pressure by the feed rollers 20, the dancer roller 21 nor by the pressure developing unit 22. After these operations are completed, the microcapsule sheet 12 is directed to a reverse direction, so that the unexposed area of the microcapsule sheet 12 can undergo light exposure.

Further, in case of the standby state of the image recording operation, the dancer roller 21 is moved to the another position B. Therefore, in this state, the microcapsule sheet is out of contact with the dancer roller 21.

As described above in the image recording apparatus of this embodiment, even through the surface of the dancer roller or the sheet slack absorbing roller is arranged to be in contact with the microcapsule surface of the microcapsule sheet for the normal copying operation, the dancer roller can be moved to the non-contact position so that the unexposed microcapsule sheet portion can be separated from the dancer roller. Therefore, no contamination occur in the unexposed area of the microcapsule sheet. Accordingly, the unexposed area fed to the downstream portion with respect to the exposure stand can be used for the next image recording operation by the reverse travel of the microcapsule sheet, and therefore, the microcapsule sheet can be economically used, and constant image recording quality is obtainable. Further, by this arrangement, contamination to the surface of the dancer roller can also be reduced.

Further, during standby state of the image recording operation, or during non-operation of the apparatus, the position of the dancer roller is maintained in out of contact with the microcapsule sheet. Therefore, contamination to the dancer roller from the microcapsules is also avoidable.

Furthermore, in the present apparatus, the dancer roller or the sheet slack absorbing roller can be positioned closely below the microcapsule sheet path. Therefore, for the automatic sheet loading, the leader tape portion of the microcapsule sheet can be guided by the dancer roller surface, and therefore, the leader tape portion can be directed to the pressure developing unit and to the takeup shaft. In other words, the dancer roller can serve as a guide means, and therefore, any additional guide member for guiding travel of the leader portion can be dispensed with.

Moreover, in the present apparatus, since the dancer roller or the sheet slack absorbing roller is pivotally moved about the sheet feed roller shaft, simple driving mechanism is available for providing the angular rotational movement of the dancer roller, and further, large moving distance of the dancer roller is attainable capable of absorbing great amount of sheet slack within a limited internal space of the image recording apparatus.

While the invention has been described in detail and with reference to specific embodiment thereof, it would be apparent to those skilled in the art that various changes and modifications can be made therein without departing from the spirit and scope of the invention.

What is claimed is:

1. An image recording apparatus which uses an elongated photosensitive recording medium having a photosensitive pressure sensitive layer comprises;

sheet feed means for feeding the elongated photosensitive recording medium;

an exposure unit for exposing the photosensitive recording medium to light for forming a latent image thereon;

a pressure developing unit positioned downstream of the exposure unit with respect to the sheet feeding direction for pressure developing the latent image on the photosensitive recording medium into a visible image;

a sheet slack absorbing means positioned between the exposure unit and the pressure developing unit, the sheet slack absorbing means being pivotably movable between a first position to absorb a sheet slack with contacting the photosensitive pressure sensitive layer and a second position out of contact with the photosensitive recording medium; and drive means for selectively driving the sheet slack absorbing means to one of the first and the second positions.

2. The image recording apparatus as claimed in claim 1, wherein the exposure unit comprises an exposure table on which the photosensitive recording medium travels for forming the latent image on the medium, and wherein the sheet feeding means comprises a sheet feed roller positioned at a downstream side of the exposure stand, and wherein the sheet slack absorbing means comprises a dancer roller positioned at a downstream side of the sheet feed roller, the dancer roller serving as a guide means when it is positioned in the second position for directing a leader portion of the photosensitive recording medium toward the pressure developing unit.

3. The image recording apparatus as claimed in claim 2, wherein the dancer roller is pivotable about an axis of the feed roller.

4. The image recording apparatus as claimed in claim 3, wherein the dancer roller comprises a dancer roller shaft, a pair of bearings mounted on the dancer roller shaft, and a pipe member coaxially disposed over the dancer roller shaft and rotatably supported by the pair of bearings, and wherein the feed roller comprises a feed roller shaft rotatably supported by a frame and second pair of bearings mounted on the feed roller shaft, and wherein the drive means comprises; a pair of arms extending between first and second pairs of bearings and provided integral with the dancer roller shaft; a drive source, a gear mounted on the feed roller shaft and provided with a radially extending projection abuttable on the dancer roller shaft, and a biasing means connected to the dancer roller shaft for selectively urging the dancer roller shaft toward one of the first and the second positions.

* * * * *